(12) United States Patent
Kim et al.

(10) Patent No.: US 7,254,087 B2
(45) Date of Patent: Aug. 7, 2007

(54) MULTI-PORT MEMORY DEVICE

(75) Inventors: Kyung-Whan Kim, Kyoungki-do (KR); Jae-Jin Lee, Kyoungki-do (KR)

(73) Assignee: Hynix Semiconductors, Inc. (KR)

( * ) Notice: Subject to any disclaimer, the term of this patent is extended or adjusted under 35 U.S.C. 154(b) by 68 days.

(21) Appl. No.: 11/322,789

(22) Filed: Dec. 29, 2005

(65) Prior Publication Data
US 2006/0238215 A1    Oct. 26, 2006

(30) Foreign Application Priority Data
Apr. 8, 2005    (KR) .................. 10-2005-0029431

(51) Int. Cl.
*G11C 8/00* (2006.01)
(52) U.S. Cl. ............ 365/230.05; 365/198; 365/189.09; 365/189.11
(58) Field of Classification Search .......... 365/230.05, 365/198, 189.09, 189.11
See application file for complete search history.

(56) References Cited

U.S. PATENT DOCUMENTS

| 6,643,787 | B1 | 11/2003 | Zerbe et al. |
| 6,681,353 | B1 | 1/2004 | Barrow |
| 6,914,847 | B1 | 7/2005 | Park |
| 7,046,575 | B2 * | 5/2006 | Shin ...................... 365/230.05 |
| 2005/0047255 | A1 | 3/2005 | Park et al. |
| 2005/0135158 | A1 | 6/2005 | Park |
| 2005/0141322 | A1 | 6/2005 | Park |

FOREIGN PATENT DOCUMENTS

| KR | 2005-0063306 | 6/2005 |
| KR | 2005-0022855 | 8/2005 |

* cited by examiner

*Primary Examiner*—Tuan T. Nguyen
(74) *Attorney, Agent, or Firm*—Blakely Sokoloff Taylor & Zafman

(57) ABSTRACT

A multi-port memory device improves efficiency of a global data drive by controlling the global data bus to transmit data in a predetermined range. The multi-port memory device includes a global data bus; transmitters and receivers; a termination unit for controlling the global data bus to transmit the data in a range between a first voltage and a second voltage in response to an active mode signal; and a voltage generator for generating the first and the second voltages. The first voltage is higher than a ground voltage and the second voltage is lower than a power supply voltage.

23 Claims, 17 Drawing Sheets

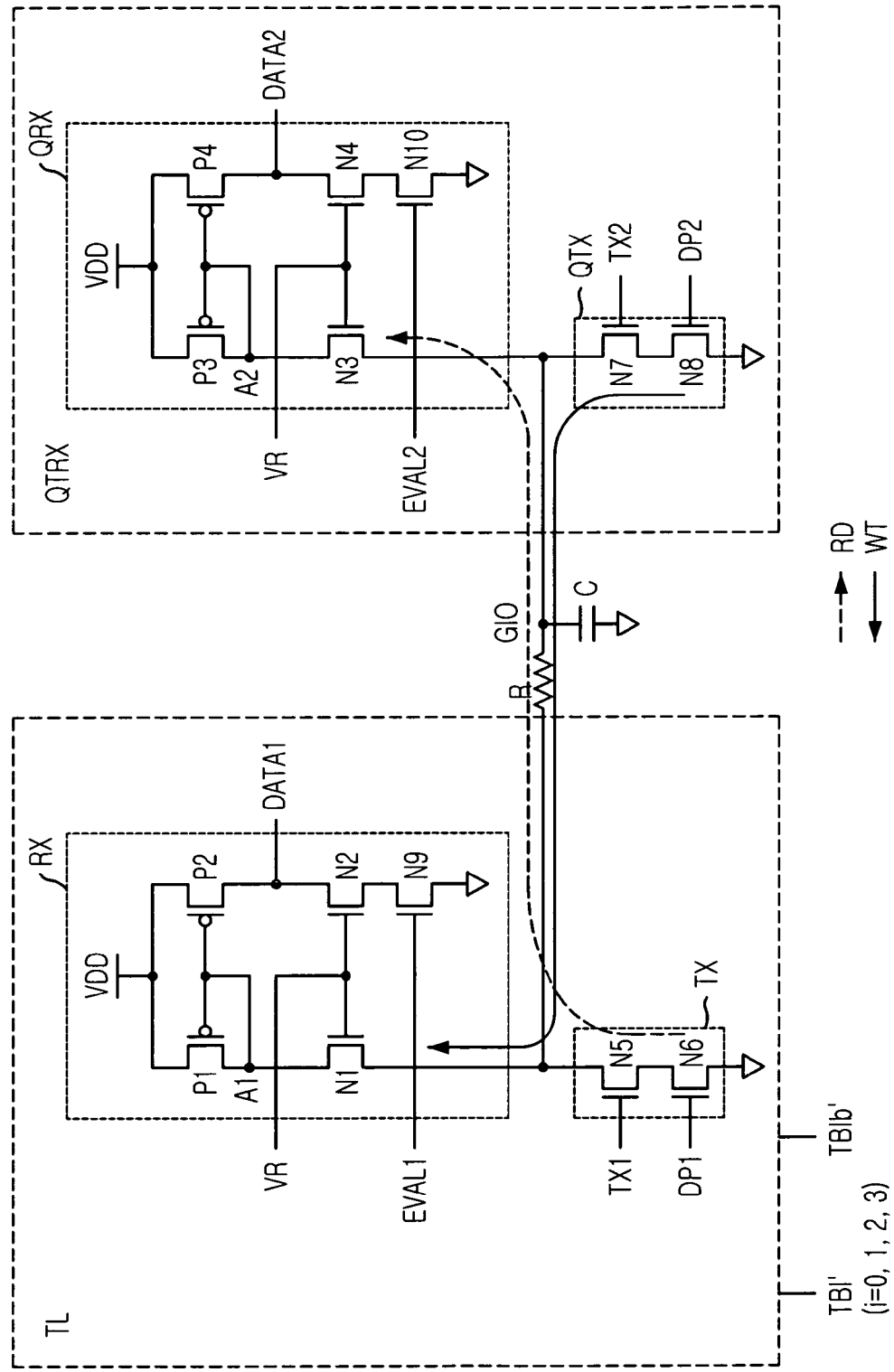

MULTI-PORT MEMORY DEVICE

FIELD OF THE INVENTION

The present invention relates to a multi-port memory device, and, more particularly, to a multi-port memory device for performing effective data transmission.

DESCRIPTION OF RELATED ARTS

Most memory devices including DRAM contain a single port for exchanging data with a chipset. Herein, the single port usually includes a plurality of I/O pin sets. Meanwhile, a functional classification of the chipset and the memory device becomes more ambiguous. Therefore, it is seriously considered by designers to integrate the memory device and the chipset. In order to satisfy the integration, a multi-port memory device for directly exchanging data with peripheral devices such as a graphic device and a CPU is required. For implementing the multi-port memory device, every port in the multi-port memory device has to access every memory cell in the multi-port memory device.

FIG. 1 is a block diagram describing a 256M multi-port memory device disclosed in a commonly owned co-pending application, U.S. Ser. No. 10/750,156, filed on Dec. 31, 2003, entitled "MULTI-PORT MEMORY DEVICE", which is incorporated herein by reference.

As shown, the 256M multi-port memory device includes a plurality of banks BANK0 to BANK15, a plurality of row decoders RDEC, a controller 100, a plurality of ports PORT0 to PORT7, four global data buses GIO_LU, GIO_RU, GIO_LD, and GIO_RD, first and second global data bus connectors PR_U and PR_D, a plurality of transfer buses TBs, a plurality of transfer bus connectors TGs, a plurality of bus connectors TLs, and a plurality of data transfer units QTRXs.

Each of the banks BANK0 to BANK15 includes an 8K_2K DRAM, i.e., 16M DRAM, the row decoder RDEC, and a core circuit, such as a sense amplifier and an equalizer, which are necessary for general DRAM core area. Every four banks of the banks BANK0 to BANK15 are arranged in a row at a corresponding quadrant dividing the core area into four. In the concrete, there are included BANK0, BANK2, BANK4, and BANK6 in a first quadrant placed in an upper left side of the core area. BANK8, BANK10, BANK12, and BANK14 are in a second quadrant placed in an upper right side of the core area. BANK1, BANK3, BANK5, BANK7 are in a third quadrant placed in a lower left side of the core area. BANK9, BANK11, BANK13, and BANK15 are in a fourth quadrant placed in a lower right side of the core area. Meanwhile, it is advisable to arrange the two row decoders RDEC between each neighboring bank in the same quadrant. Further, a column of the banks BANK0 to BANK15 is divided into four segments. Thus, each of the four segments is constituted with 512 cells.

The controller 100 generates an internal command signal, an internal address signal, and a control signal to control an operation of the memory device. The internal command signal includes an internal active command signal ACT, an internal precharge command signal PCG, an internal read command signal RD, and an internal write command signal WD. The internal address signal includes an active array address AAA, a precharge array address PAA, a read array address RAA, a write array address WAA, a row address RA, a read segment address RSA, and a write segment address WSA. The control signal includes transfer gate control signal TGC, a port/pipe register flag signal PRFG, a port/pipe register data driving signal DP, and a DRAM core test mode flag signal DTM.

The ports PORT0 to PORT7 are placed at the margin of a die. Every two ports of the ports PORT0 to PORT7 are arranged in each of the quadrants. In detail, PORT0 and PORT2 are in the first quadrant; PORT4 and PORT6 are in the second quadrant; PORT1 and PORT3 are in the third quadrant; PORT5 and PORT7 are in the fourth quadrant. Each of the ports PORT0 to PORT7 supports a serial I/O interface and communicates independently with a different target device such as a graphic chip. When the ports PORT0 to PORT7 support the serial I/O interface, every port has a plurality of pads corresponding to data, commands, and addresses, a plurality of pad buffers for buffering a signal transmitted to the pads, a decoder for decoding data to be transmitted, an encoder for encoding received data, and data transformer for transforming the serial received data into parallel data or transforming the parallel data into serial data.

The first to fourth global data buses GIO_LU, GIO_RU, GIO_LD, and GIO_RD are placed between the bank and the port of the corresponding quadrants, respectively. In detail, the first global data bus GIO_LU is in the first quadrant; the second global data bus GIO_RU is in the second quadrant; the third global data bus GIO_LD is in the third quadrant; the fourth global data bus GIO_RD is in the fourth quadrant. The four global data buses GIO_LU, GIO_RU, GIO_LD, and GIO_RD are 512-bit bidirectional data buses coupled to the banks and the ports of the corresponding quadrant and the first and the second global data bus connectors PR_U and PR_D.

Herein, the first global data bus GIO_LU and the second global data bus GIO_RU are connected through the first global data bus connector PR_U. The third global data bus GIO_LD and the fourth global data bus GIO_RD are connected through the second global data bus connector PR_D. The first and second global data bus connector PR_U and PR_D include 512 numbers of bidirectional pipe registers corresponding to the 512-bit global data buses.

The transfer bus TB is a local data bus connecting a bit line sense amplifier and the bus connectors TL of the corresponding bank. The number of lines of the transfer bus TB corresponds to the number of cells in one segment, e.g., 512. The transfer bus TB is implemented with a differential bus.

The transfer bus connector TG is implemented with a plurality of MOS transistors. The number of the MOS transistors corresponds to the number of lines of the transfer bus TB. Because the transfer bus TB is the differential bus, one transfer bus connector TG is implemented with 512 pairs of MOS transistors. Accordingly, the transfer bus connector TG is called a transfer gate.

One set of transfer latch is formed with 512 numbers of transfer latches. The bus connector TL includes 16 sets of transfer latches. Each transfer latch includes a first bus connecting circuit for a read operation and a second bus connecting circuit for a write operation. Herein, the first bus connecting circuit corresponds to an I/O sense amplifier of DRAM and includes a read sense amplifier for sensing and latching a read data on the transfer bus TB and a read driver for driving the latched read data into the global data bus of the corresponding quadrant. Further, the second bus connecting circuit corresponds to a write driver of DRAM and includes a write latch for sensing and latching write data on the global data bus and a write driver for driving write data into the transfer bus TB.

The data transfer unit QTRX includes 512 numbers of transmitters QTX for transmitting write data inputted to a corresponding port and 512 receivers QRX for receiving a read data inputted from the global data bus to transmit to a corresponding port.

Although not shown in FIG. 1, the 256M multi-port DRAM further includes a voltage generator, test logic, and various pads, including a clock pad. The voltage generator placed at the margin of the 256M multi-port DRAM receives an external voltage to generate an internal voltage. The test logic is arranged between the ports corresponding to the first quadrant and the second quadrant and arranged between the ports corresponding to the third quadrant and the fourth quadrant. The pads are also placed at the margin of the 256M multi-port DRAM.

Further, each of the quadrants includes command lines for receiving the internal command signals and 2-bit address lines for receiving the internal address lines. The command lines and the address lines deliver signals from the controller 100 to the banks BANK0 to BANK15. At each of the left and right side of the controller 100, a 4-bit transfer gate control line TGC<0:3> connects the controller 100 to the transfer bus connector TG.

FIG. 2 is a block diagram showing a relationship between the transfer bus and the segment, i.e., a column unit of the 256M multi-port DRAM shown in FIG. 1.

As shown, the 256M multi-port DRAM includes a memory cell array 200 and a bit line sense amplifier array 210. Referring to a block denoted as A, one transfer bus pair TB<0> and TBb<0> of the memory cell array 200 are connected to four bit line sense amplifiers BLSA arranged upper and lower side of the memory cell array 200. The four bit line sense amplifier BLSA are controlled by a segment select signal SGS<0:3>, respectively. Herein, the segment select signal SGS corresponds to a column select signal Yi of the conventional DRAM. In case of a 2K column, when a predetermined row and a predetermined segment are selected at the same time, 512 cells are selected and data of the 512 cells are transferred into the 512-bit transfer bus TB<0:511> corresponding to the 512 cells.

Each of the transfer buses TB in the first quadrant is connected to a corresponding transfer bus TB in the third quadrant through the transfer gate TG. Herein, one set of the transfer gate is constituted with 512 transfer gates TG and eight sets of transfer gates TG are provided in the 256M multi-port DRAM. That is, the transfer gate is placed between two transfer buses TB, each corresponding to two banks arranged in the same column to selectively connect the two transfer buses TB to each other. The transfer gate control signal TCG for controlling the transfer gate TG is generated in the controller 100.

Hereinafter, an operation of the 256M multi-port DRAM is explained.

FIGS. 3A and 3B are block diagrams describing a normal read path and a normal write path of the 256M multi-port DRAM, respectively.

Herein, the normal read and write paths refer to data paths of the read and the write operations that occurred in the same quadrant. For example, in the case of the normal read and write paths, the commands and addresses for the read or write operation inputted through a port in the first quadrant, i.e., the first port PORT1 or the third port PORT2, are only able to access the memory cells in the first quadrant.

As shown in FIG. 3A, when the 256M multi-port DRAM reads 512-bit read data from a predetermined segment in the first bank BANK0 through the first port PORT0, the commands and addresses relating to the read operation are inputted to the controller 100 in a form of a packet through the first port PORT0. The controller 100 generates the internal active command signal ACT, the active array address AAA, and the row address RA corresponding to the first bank BANK0 to activate a predetermined row, i.e., a word line WL, in the first bank BANK0. Then, the controller 100 generates the read command signal RD, the read array address RAA, and read segment address RSA corresponding to the first bank BANK0. The bit line sense amplifier BLSA senses and amplifies the 512-bit read data of a segment corresponding to the read segment address RSA to transfer the 512-bit read data to the pair of transfer buses TB and TBb.

Meanwhile, the bus connector TL of the first bank BANK0 senses the 512-bit read data loaded on the pair of transfer buses TB and TBb and, then, transmits the 512-bit read data to the first global data bus GIO_LU. Subsequently, the 512-bit read data transmitted to the first global data bus GIO_LU is buffered in a read buffer of the first port PORT0 after passing through the receiver QRX of the data transfer unit QTRX corresponding to the first port PORT0. The 512-bit read data in read buffer is transformed to packets of a predetermined size and serially transmitted to a target device connected to the first port PORT0.

Next, the controller 100 generates the internal precharge command signal PCG and the precharge array address PAA to inactivate the word line WL. The transfer bus connector TG corresponding to the internal precharge command signal PCG and the precharge array address PAA is switched-off. Therefore, the transfer bus pair TB and TBb of the first bank BANK0 and the transfer bus pair TB and TBb of the second bank BANK1 are disconnected. Herein, in FIG. 3A, BL and BLb denote a bit line pair; T denotes a cell transistor; and C denotes a cell capacitor.

Hereinafter, a case in which the 256M multi-port DRAM writes 512-bit write data to a predetermined segment in the first bank BANK0 through the first port PORT0 is explained by referring FIG. 3B.

As shown, after the commands and addresses relating to the write operation and the 512-bit write data are inputted to the controller 100 in packet form through the first port PORT0, the controller 100 generates the internal active command signal ACT, the active array address AAA, and the row address RA corresponding to the first bank BANK0 to activate a predetermined row, i.e., a word line WL, in the first bank BANK0. Then, the controller 100 generates the internal write command signal WD, the write array address WAA, and the write segment address WSA corresponding to the first bank BANK0.

The 512-bit write data buffered in a write buffer of the first port PORT0 is written to the segment corresponding to the write segment address WSA in accordance with a scheduling of the controller 100. That is, the 512-bit write data transformed into parallel data is loaded to the first global data bus GIO_LU through the transmitter QTX of the data transfer units QTRX. Then, the 512-bit write data is loaded to the pair of transfer buses TB and TBb after passing through the bus connector TL of the first bank BANK0. Subsequently, the 512-bit write data loaded in the pair of transfer buses TB and TBb is stored in 512 numbers of memory cells, i.e., the segment, by the bit line sense amplifier BLSA corresponding to the write segment address WSA.

Finally, the controller 100 generates the internal precharge command signal PCG and the precharge array address PAA to inactivate the word line.

FIGS. 4A and 4B are block diagrams describing a cross read path and a cross write path of the 256M multi-port DRAM, respectively.

Herein, the cross read and write paths refer to data paths of the read and the write operations that occur between different quadrants, respectively. For example, in the case of the cross read and write paths, it is possible to access the memory cells in the third quadrant for the commands, addresses, and data inputted through the first port PORT0 in the first quadrant.

As shown in FIG. 4A, when the 256M multi-port DRAM reads 512-bit read data of a predetermined segment in the first bank BANK0 through the second port PORT1, all of the operations are similar to that of the case of the normal read path. However, the transfer bus connector TG coupled between the first and the second banks BANK0 and BANK1 is switched-on and, therefore, the pair of the transfer buses TB and TBb of the first bank BANK0 and the pair of the transfer buses TB and TBb of the second bank BANK1 are connected to each other. The 512-bit read data is loaded to the transfer bus pair TB and TBb of the second bank BANK1 and transmitted to a target device after passing through the bus connectors TL connected to the second bank BANK1, the third global data bus GIO_LD, the data transfer unit QTRX connected to the second port PORT1, and the second port PORT1.

Next, the case where the 256M multi-port DRAM writes a 512-bit write data to a predetermined segment in the first bank BANK0 through the second port PORT1 is explained, referring to FIG. 4B.

As shown, all of the operations are similar to that of the normal write path. However, the transfer bus connector TG coupled between the first and the second banks BANK0 and BANK1 is switched-on; and, therefore, the transfer bus pair TB and TBb of the first bank BANK0 and the pair of the transfer bus TB and TBb of the second bank BANK1 are connected. In this case, the 512-bit write data inputted through the second port PORT1 is loaded on the transfer bus pair TB and TBb of the first bank BANK0 after passing through the data transfer unit QTRX connected to the second port PORT1, the third global data bus GIO_LD, the bus connectors TL connected to the second bank BANK1. The process thereafter is the same as that of the normal write.

When the data is transmitted between the first and the second global data buses GIO_LU and GIO_RU, the first and the second global data buses GIO_LU and GIO_RU are connected via the first global data bus connector PR_U. Further, when the data is transferred between the third and the fourth global data buses GIO_LD and GIO_RD, the third and the fourth global data buses GIO_LD and GIO_RD are connected through the second global data bus connector PR_D.

As previously mentioned, every port PORT0 to PORT7 in the conventional 256M multi-port memory device can access every segment in the conventional 256M multi-port memory device. Further, because each of the ports PORT0 to PORT7 accesses the segment independently, the segment can be concurrently accessed by plural ports PORT0 to PORT7 as long as each of the four global buses GIO_LU to GIO_RD are not used concurrently. Moreover, the data is inputted or outputted serially between the ports PORT0 to PORT7 and the target device and the 512-bit data is processed in a parallel manner between the ports PORT0 to PORT7 and each quadrant of the core area.

FIG. 5 is a diagram showing a data transmitting structure of the 256M multi-port DRAM shown in FIG. 1.

As shown, the 256M multi-port DRAM includes a global data bus GIO for use in exchanging data between an input/output interface, i.e., a port and a memory cell block, i.e., a bank. Further, the 256M multi-port DRAM also includes data transfer units QTRX for receiving or transmitting data between the global data bus GIO and the port and bus connectors TL for receiving or transmitting data between the global data bus GIO and the bank.

FIG. 6 is a block diagram describing a structure of the global data bus GIO shown in FIG. 5.

As shown, the 256M multi-port DRAM is divided into four quadrants QUADRANT_LU, QUADRANT_RU, QUADRANT_LD, and QUADRANT_RD. Each of the four quadrants has the same structure and operates independently.

Looking at the first quadrant QUADRANT_LU, the first global data bus GIO_LU is connected to four banks BANK0, BANK2, BANK4, and BANK6, two ports PORT0 and PORT2, and the first global data bus connector PR_U. That is, seven blocks are connected to one global data bus. When global data is shared by several blocks, the load of the global data increases and data interference occurs.

FIG. 7 is a block diagram showing a worst read case and a worst write case of the 256M multi-port DRAM shown in FIG. 1.

As shown, a single global data bus is provided with 512 bus lines and is formed with a hierarchical wiring structure. That is, a first metal wire and a second metal wire are provided for vertical and horizontal bus lines, respectively. Generally, a resistance of the first metal wire for the vertical bus line is higher than the resistance of the second metal wire for the horizontal bus line.

Meanwhile, the length of the first metal wires connected to a single bank are different from one another. Therefore, the loading value of each bus line becomes different. The loading value also can be varied depending on a data transmit path as well as the difference of the length of the first metal wire. For example, the data transmit path between the first port PORT0 and the seventh bank BANK6 is the longest path in FIG. 7. Therefore, the loading value between the first port PORT0 and the seventh bank BANK6 has the largest value and, thus, the read or write operation occurring between the first port PORT0 and the seventh bank BANK6 becomes the worst read or write case.

As previously mentioned, the 256M multi-port DRAM includes the 512-bit global data bus. When the number of the bus lines in the global data bus is more than 64-bits, a great amount of a current is consumed.

In order to reduce the problem caused by the great current consumption of the wide band global data bus, the applicant of the present application proposes a global data bus structure using a current sense method instead of a voltage drive method in U.S. Ser. No. 10/788,704.

FIG. 8 is a block diagram describing a data transfer unit QTRX and bus connector TL disclosed in a commonly owned co-pending application, U.S. Ser. No. 10/788,704, filed on Feb. 27, 2004, entitled "SEMICONDUCTOR MEMORY DEVICE", which is incorporated herein by reference.

As shown, the bus connector TL and the data transfer unit QTRX are connected through the global data bus GIO.

A receiver RX of the bus connector TL is provided with two PMOS transistors P1 and P2, three NMOS transistors N1, N2, and N9. First terminals of the first PMOS transistor P1 and the second PMOS transistor P2 are connected to a power voltage source VDD. A second terminal and a gate of the first PMOS transistor P1 are diode-connected to each other. A second terminal of the second PMOS transistor P2 is connected to a first output terminal. A first terminal of the first NMOS transistor N1 is connected with the second terminal of the first PMOS transistor P1 at node A1. A second terminal of the first NMOS transistor N1 is connected to the global data bus GIO. The first NMOS transistor N1 and the second NMOS transistor N2 receive a reference voltage VR through gates. A first terminal of the second NMOS transistor N2 is connected to the first output terminal. The ninth NMOS transistor receives an evaluation signal EVAL1 through a gate. A first terminal of the ninth transistor N9 is connected to a second terminal of the second NMOS transistor N2; and the second terminal of the ninth transistor N9 is connected to the ground voltage VSS.

A transmitter TX of the bus connector TL is connected between a ground voltage VSS and the global data bus GIO and includes two NMOS transistors N5 and N6. The fifth NMOS transistor N5 receives a first data TX1 through a gate; the sixth NMOS transistor N6 receives a first drive pulse DP1 through a gate.

The receiver QRX of the transfer unit QTRX is provided with two PMOS transistors P3 and P4, three NMOS transistors N3, N4, and N10. First terminals of the third PMOS transistor P3 and the fourth PMOS transistor P4 are connected to the power voltage source VDD. A second terminal and a gate of the third PMOS transistor P3 are diode-connected to each other. A second terminal of the fourth PMOS transistor P4 is connected to a second output terminal. A first terminal of the third NMOS transistor N3 is connected with the second terminal of the third PMOS transistor P3 at node A2. A second terminal of the third NMOS transistor N3 is connected to the global data bus GIO. The third NMOS transistor N3 and the fourth NMOS transistor N4 receive the reference voltage VR through their gates. A first terminal of the fourth NMOS transistor N4 is connected to the second output terminal. The tenth NMOS transistor N10 receives a second evaluation signal EVAL2 through a gate. A first terminal of the tenth transistor N10 is connected to a second terminal of the fourth NMOS transistor N4; and a second terminal of the tenth transistor N10 is connected to the ground voltage VSS.

A transmitter QTX of the transfer unit QTRX is connected between the ground voltage VSS and the global data bus GIO and includes two NMOS transistors N7 and N8. The seventh NMOS transistor N7 receives a second data TX2 through a gate; the eighth NMOS transistor N8 receives a second drive pulse DP2 through a gate.

The global data bus GIO, though actually implemented with a long metal wire, can be modeled with a resister R and a capacitor C, which have equivalent value with the metal wire.

When the read operation RD is performed, data is transmitted between the transmitter TX of the bus connector TL and the receiver QRX of the data transfer unit QTRX through the global data bus GIO. Meanwhile, when the write operation WT is performed, the data is transmitted between the transmitter QTX of the data transfer unit QTRX and the receiver RX of the bus connector TL through the global data bus GIO.

As previously mentioned, the read and write operations are performed in a way that the transmitters TX and QTX charge or discharge the global data bus GIO in response to the first and the second data TX1 and TX2 and, then, the receivers RX and QRX sense the status of the global data bus GIO.

FIGS. 9A and 9B are waveforms showing the read operation of the circuit shown in FIG. 8.

The first drive pulse DP1, synchronized with a clock and activated into a logic level 'H' in the read operation, makes the first data TX1 load into the global data bus GIO. The second evaluation signal EVAL2 is activated into a logic level 'H' after a predetermined time has passed since the first drive pulse DP1 is activated to evaluate the first data TX1 loaded into the global data bus GIO. The predetermined time is a time margin for charging or discharging the global data bus GIO up to a certain level.

If the first data TX1 inputted to the transmitter TX of the bus connector TL and the first drive pulse DP1 are the logic level 'H', the fifth and sixth NMOS transistors N5 and N6 are turned on and, therefore, the global data bus GIO is discharged. After a voltage level of the node A2 in the receiver QRX of the data transfer unit QTRX becomes lower than a voltage level of (VDD-VTH), the VTH being a threshold voltage of the PMOS transistor, the third and fourth PMOS transistors P3 and P4 are turned on and, thus, an output DATA2 from the receiver QRX of the data transfer unit QTRX becomes a logic level 'H'. That is, the first data TX1 having the logic level 'H' is correctly transmitted through the global data bus GIO to the output DATA2.

If the first data TX1 with a logic level 'L' is inputted to the transmitter TX of the bus connector TL and the first drive pulse DP1 is the logic level 'H', the global data GIO maintains a charged state. Therefore, the node A2 in the data transfer unit QTRX is not discharged and, subsequently, the fourth PMOS transistor P4 cannot drive the second output terminal into a logic level 'H'. Then, when the second evaluation signal EVAL2 becomes the logic level 'H', the tenth NMOS transistor N10 is turned on and, therefore, the second output terminal is discharged. Thus, the output signal DATA2 outputted from the data transfer unit QTRX becomes a logic level 'L'. That is, the first data TX1 having the logic level 'L' is correctly transmitted through the global data bus GIO to the output DATA2.

Referring to FIG. 9A, the first drive pulse DP1 is activated to the logic level 'H' four times. Namely, the first data TX1 is transmitted four times. At this time, the global data bus GIO is discharged only while both of the drive pulses DP1 and DP2 are in the logic level 'H'.

Meanwhile, since the size of the fourth PMOS transistor P4 is relatively larger than that of the tenth NMOS transistor N10, although the output signal DATA2 is not changed into a logic level 'L', it shows a little fluctuation when the second evaluation signal EVAL2 is the logic level 'H'.

As shown in FIG. 9B, there exists a possibility that the first high data can be sensed as a low data because of the fluctuation.

FIG. 10 is a waveform describing why a read failure of the first high data occurs.

When the internal read command signal RD or the internal write command signal WD is not inputted and, therefore, the read operation or the write operation is not performed for a predetermined time, the global data bus GIO is continuously charged and, eventually, reaches to a predetermined voltage level. When the global data bus GIO reaches to the predetermined voltage level and is not increased any more, the predetermined voltage level of the global data bus GIO is called a saturated GIO level.

Referring to FIG. 8, the NMOS transistors N1, N2, N3, and N4 that receive the reference voltage VR through their gates in the receivers RX and QRX of the bus connector TL and the data transfer unit QTRX. The NMOS transistors N1, N2, N3, and N4, active loads whose resistances are changed according to the reference voltage VR, control a current amount flowing to the global data bus GIO.

As a result, the saturated GIO level is determined by the reference voltage VR. That is, the NMOS transistors N1, N2, N3, and N4 determine the current amount flowing from the receivers RX and QRX to the global data bus GIO by being controlled by the reference voltage VR. When the level of the reference voltage VR is increased, the saturated GIO level is also increased. On the other hand, when the level of the reference voltage VR is decreased, the saturated GIO level is also decreased. The saturated GIO level causes the read failure of the first high data as shown in FIG. 9B.

As described in FIG. 10, while the first data TX1 of a logic high level is inputted to the transmitter TX, the global data bus GIO is discharged in response to the first drive pulse DP of a logic high level. Then, after the predetermined time has passed, the second evaluation signal EVAL2 is activated as a logic high level to evaluate the first data TX1 loaded into the global data bus GIO.

In FIG. 10, A and B respectively denote the first data TX1 of the logic high level transmitted to the receiver QRX in response to the second evaluation signal EVAL2. As shown, the voltage level A of the first high data is higher than the voltage level B of the second high data. When the first high data is transmitted, the voltage level of the global data bus GIO maintains the saturated GIO level. Therefore, the global data bus GIO cannot be fully discharged to a desired level in order to read the first high data. As a result, the receiver QRX in the data transfer units QTRX senses that the level of the first high data is a logic low level.

A time for discharging the global data bus GIO is proportionally increased to the number of loads connected to the global data bus GIO. Therefore, as the number of loads connected to the global data bus GIO is increased, the problem caused by the read failure of the first high data becomes more serious. As previously mentioned, a plurality of blocks share the global data bus GIO in the multi-port DRAM. Thus, the problem caused by the read failure of the first high data is much worse in the multi-port DRAM.

Further, a write failure can also occur when the second data TX2 is transmitted from the transmitter QTX in the data transfer units QTRX to the receiver RX in the bus connector TL.

SUMMARY OF THE INVENTION

It is, therefore, an object of the present invention to provide a multi-port memory device for improving efficiency of a global data drive by controlling the global data bus to transmit data in a predetermined range. The present invention makes it possible to minimize a layout size, facilitate a package, and increase a bandwidth without causing a skew between data lines in a data bus.

It is another object of the present invention to provide a multi-port memory device for improving data transmission speed.

In accordance with an aspect of the present invention, there is provided a multi-port memory device including: a global data bus; a plurality of current sensing transmitters and current sensing receivers for exchanging a data with the global data bus; a termination unit for controlling the global data bus to transmit the data in a range between a first voltage and a second voltage in response to an active mode signal; and a voltage generator for generating the first and the second voltages, wherein the first voltage is higher than a ground voltage and the second voltage is lower than a power supply voltage.

In accordance with another aspect of the present invention, there is provided a multi-port memory device including a global data bus; a plurality of current sensing transmitters and current sensing receivers for exchanging data with the global data bus; a termination unit for controlling the global data bus to transmit the data in a range between a ground voltage and a first voltage, which is lower than a power supply voltage, in response to an active mode signal; and a voltage generator for generating the first voltage.

In accordance with still another aspect of the present invention, there is provided a multi-port memory device a global data bus; a plurality of current sensing transmitters and current sensing receivers for exchanging data with the global data bus; a termination unit for controlling the global data bus to transmit the data in a range between a power supply voltage and a first voltage, which is higher than a ground voltage, in response to an active mode signal; and a voltage generator for generating the first voltage.

BRIEF DESCRIPTION OF THE DRAWINGS

The above and other objects and features of the present invention will become apparent from the following description of preferred embodiments taken in conjunction with the accompanying drawings, in which:

FIG. 8 is a block diagram describing a data transfer unit QTRX and bus connector TL disclosed in a commonly owned co-pending application, U.S. Ser. No. 10/788,704, filed on Feb. 27, 2004, entitled "SEMICONDUCTOR MEMORY DEVICE", which is incorporated herein by reference.

DETAILED DESCRIPTION OF THE INVENTION

Hereinafter, a multi-port semiconductor memory device in accordance with the present invention will be described in detail referring to the accompanying drawings.

Figure 1:
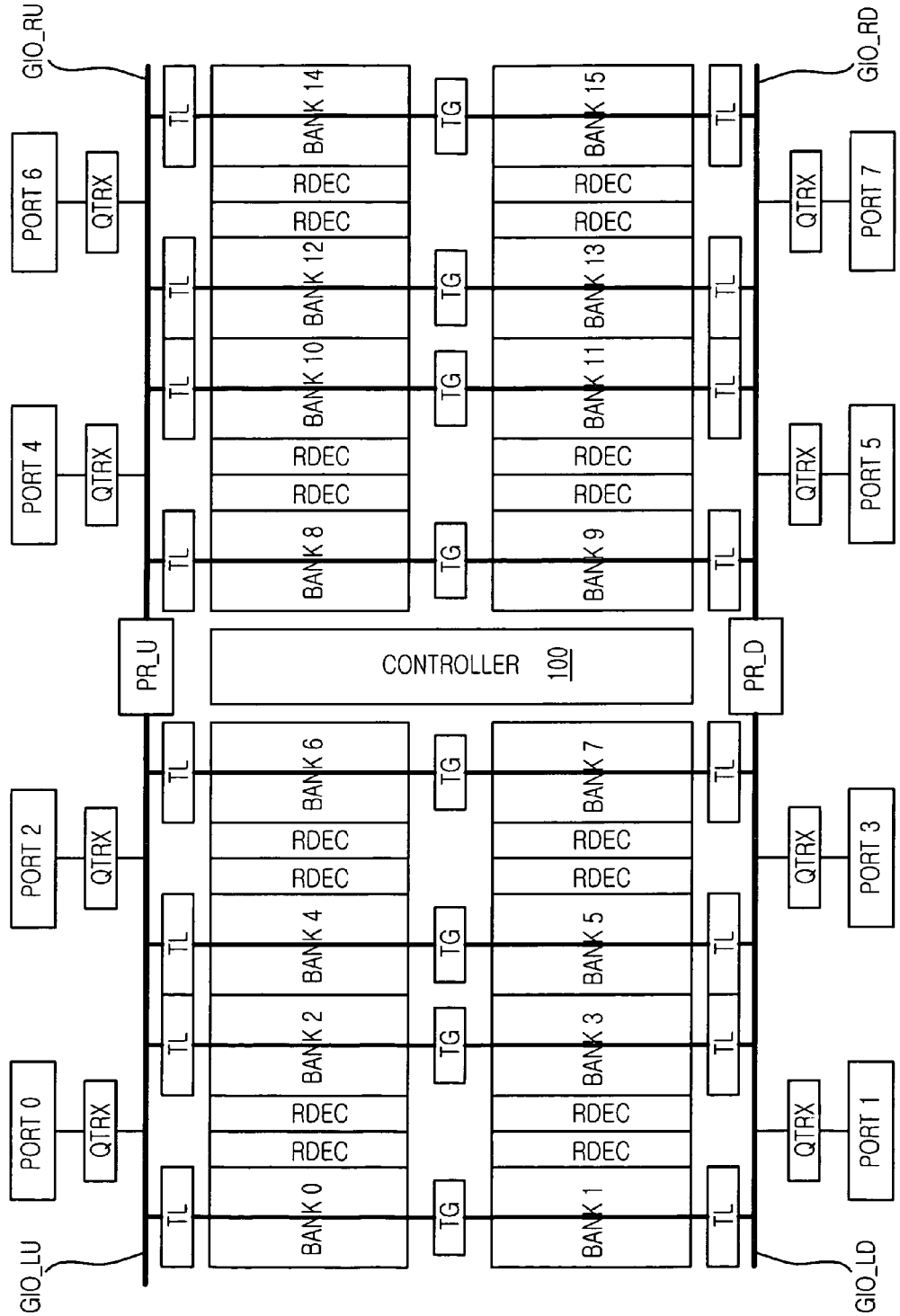
FIG. 1 is a block diagram describing an architecture of a conventional 256M multi-port memory device.
Figure 2:
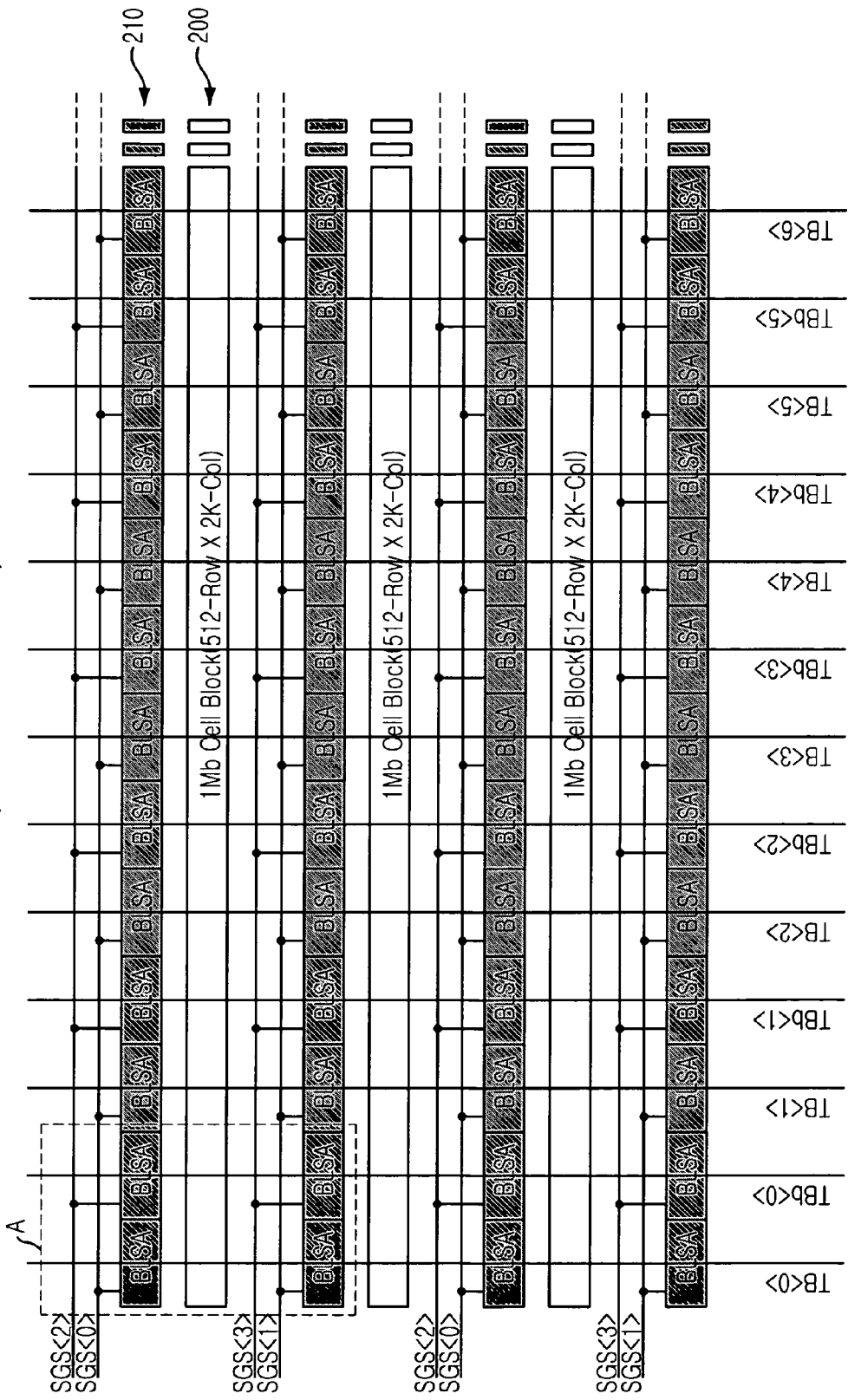
FIG. 2 is a diagram showing a relationship between a transfer bus and a segment of the conventional 256M multi-port DRAM shown in FIG. 1.
Figure 3A:
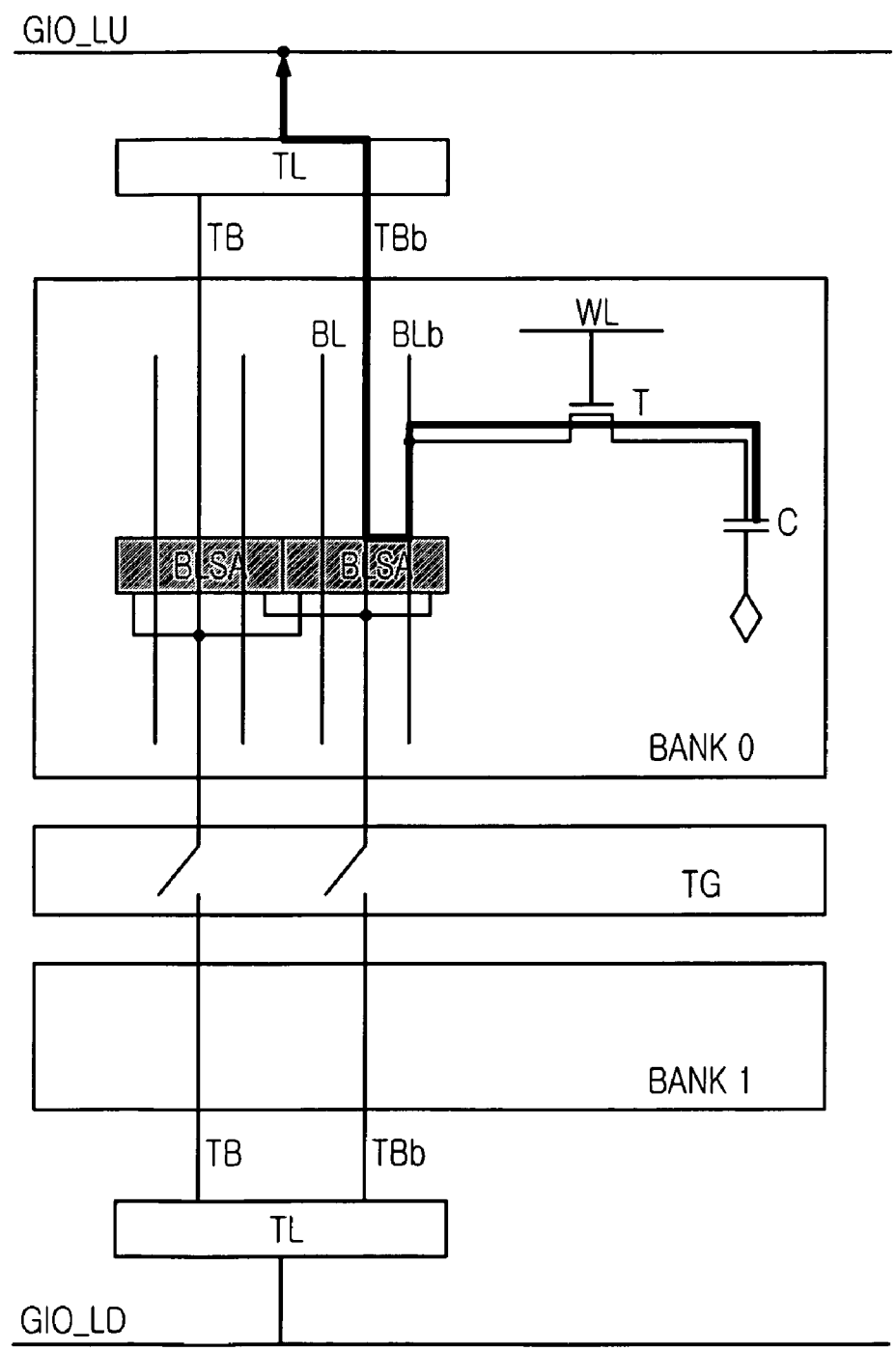
FIGS. 3A and 3B are block diagrams describing a normal read path and a normal write path of the conventional 256M multi-port DRAM, respectively.
Figure 3B:
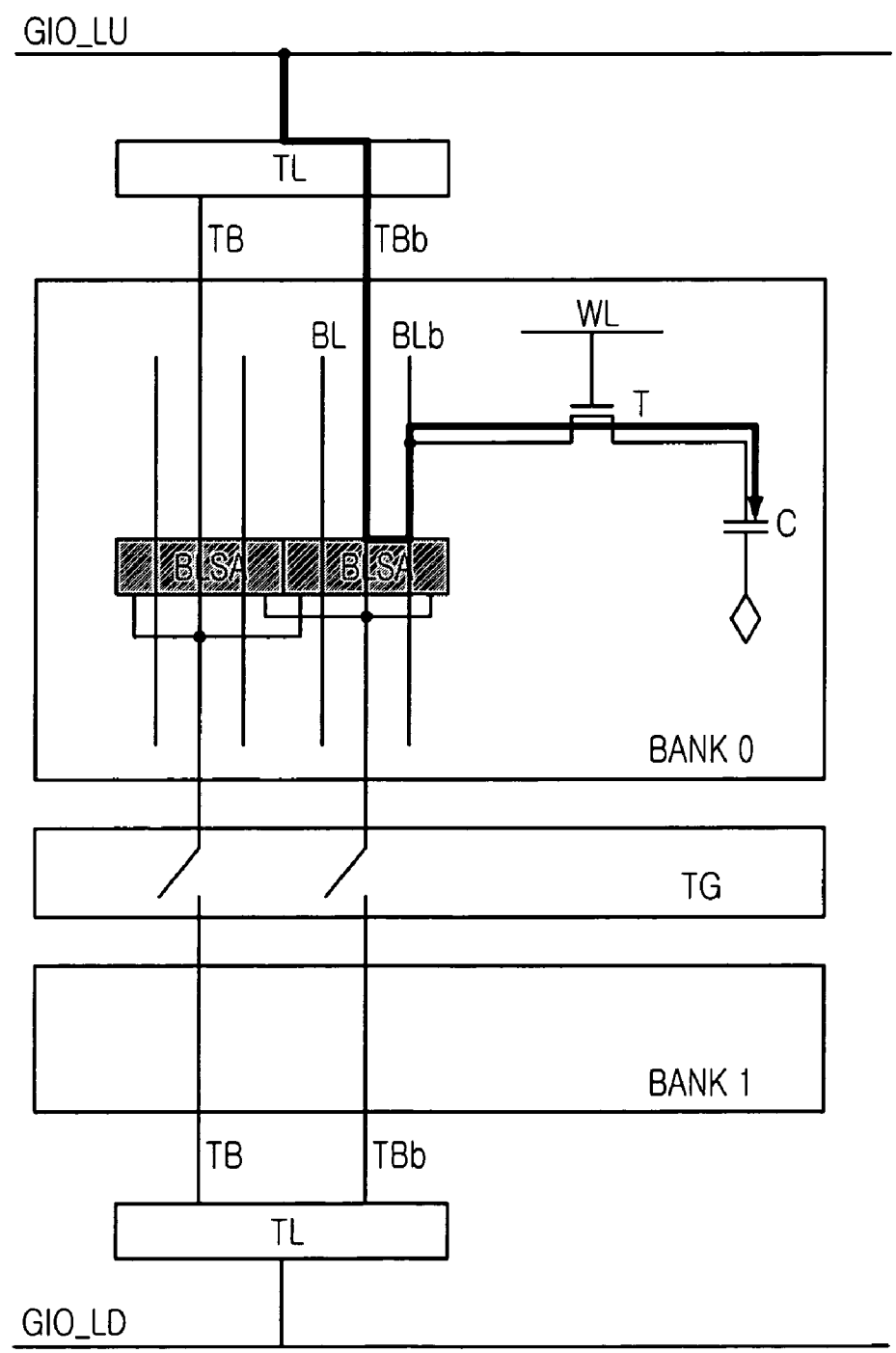
Figure 4A:
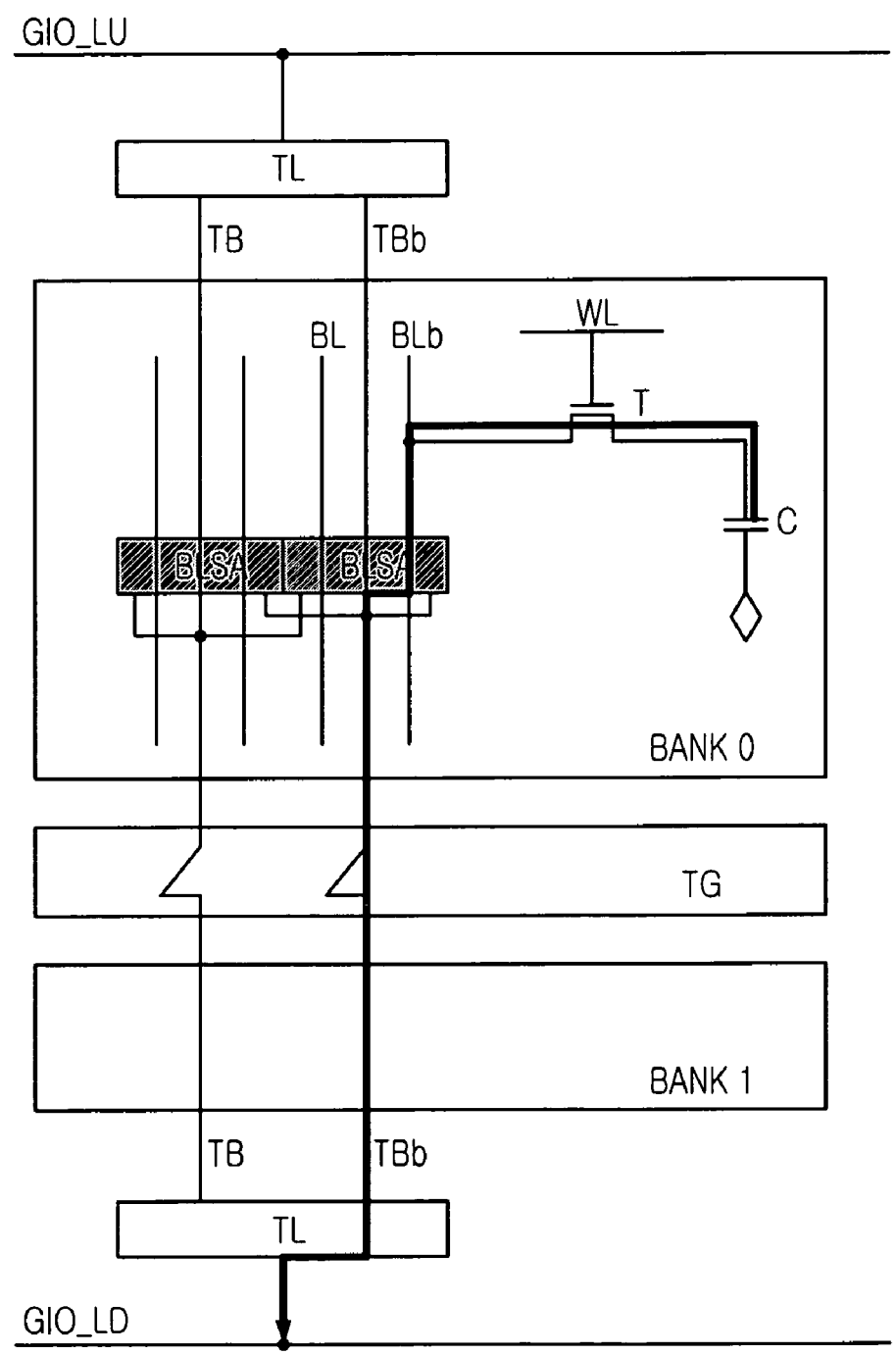
FIGS. 4A and 4B are block diagrams describing a cross read path and a cross write path of the conventional 256M multi-port DRAM, respectively.
Figure 4B:
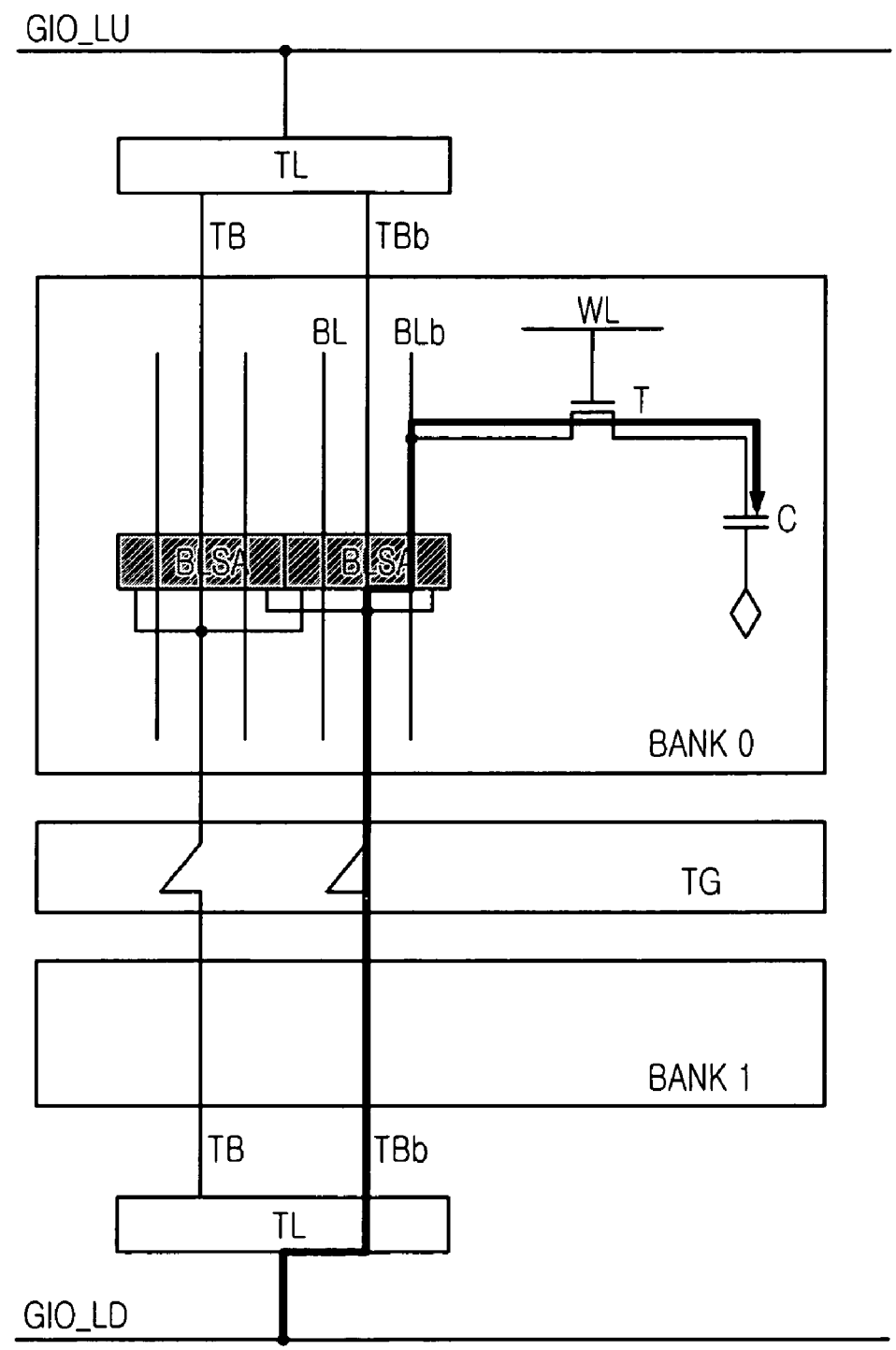
Figure 5:
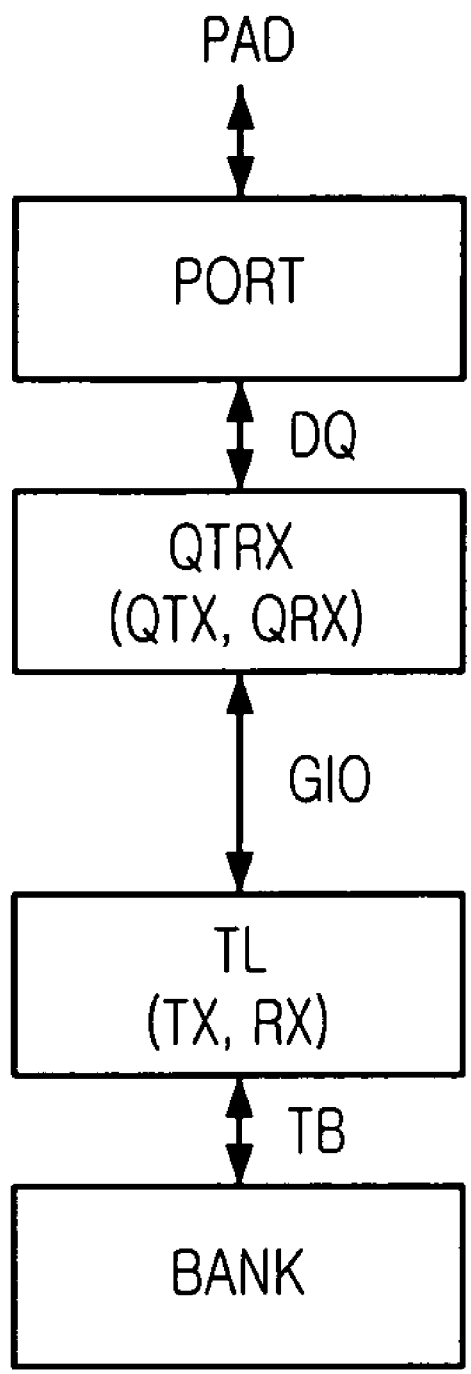
FIG. 5 is a diagram showing a data transmitting structure of the 256M multi-port DRAM shown in FIG. 1.
Figure 6:
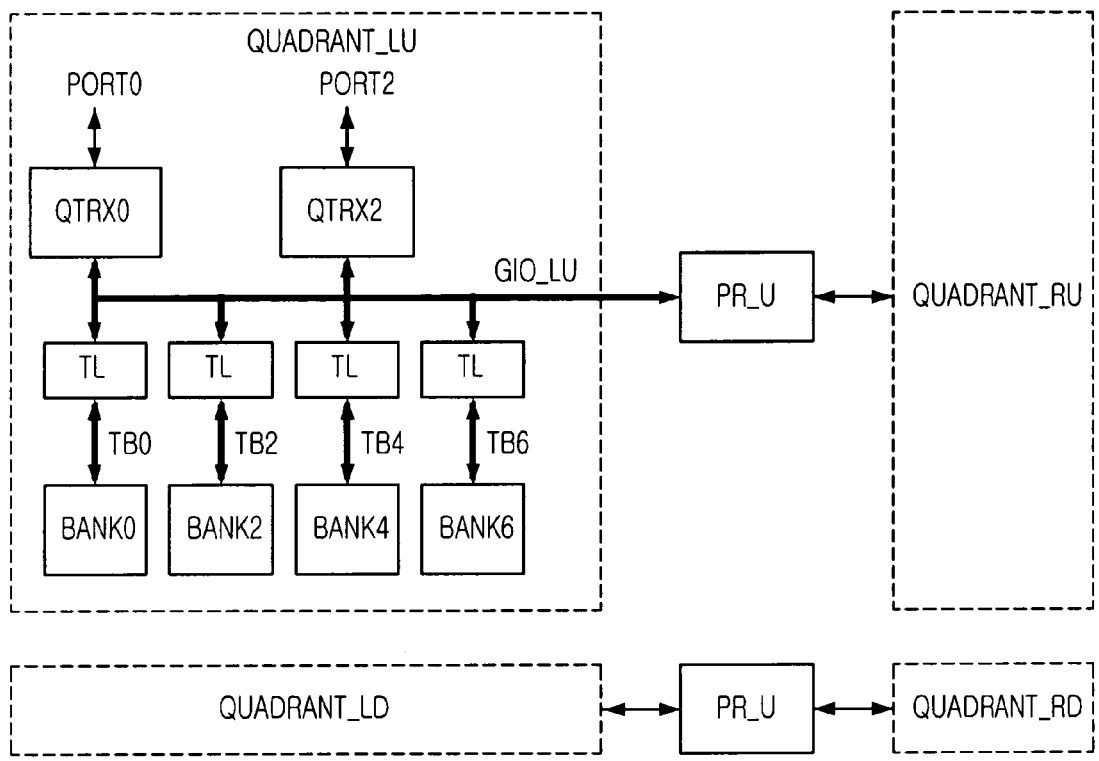
FIG. 6 is a block diagram describing a structure of the global data bus GIO shown in FIG. 5.
Figure 7:
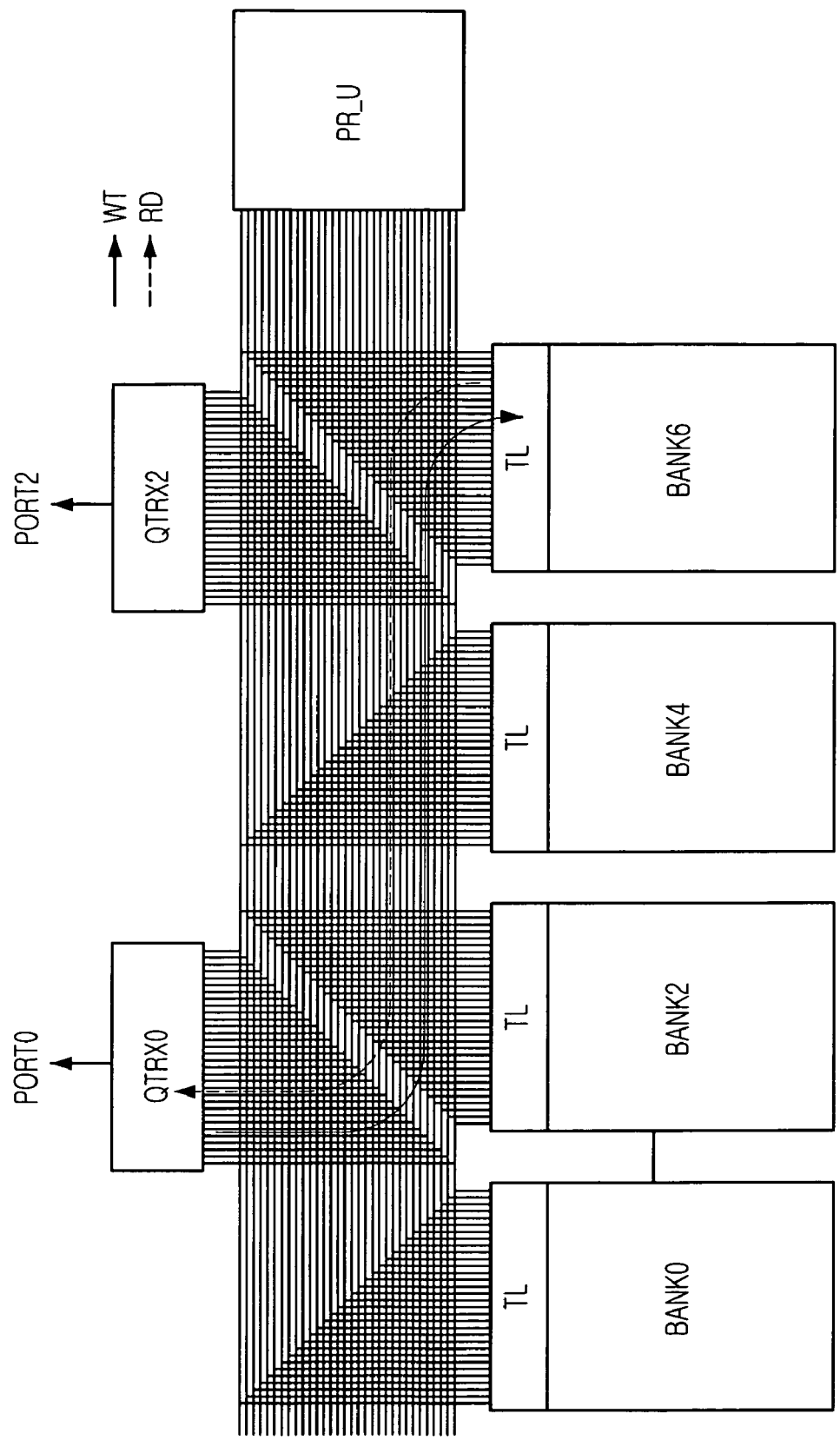
FIG. 7 is a block diagram showing a worst read case and a worst write case of the 256M multi-port DRAM shown in FIG. 1.
Figure 9A:
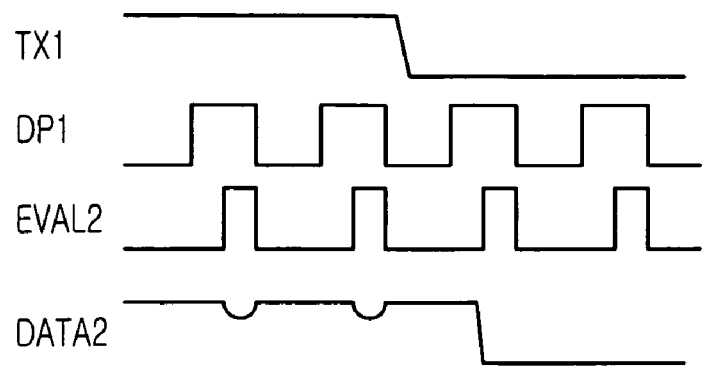
FIGS. 9A and 9B are waveforms showing the read operation of the circuit shown in FIG. 8.
Figure 9B:
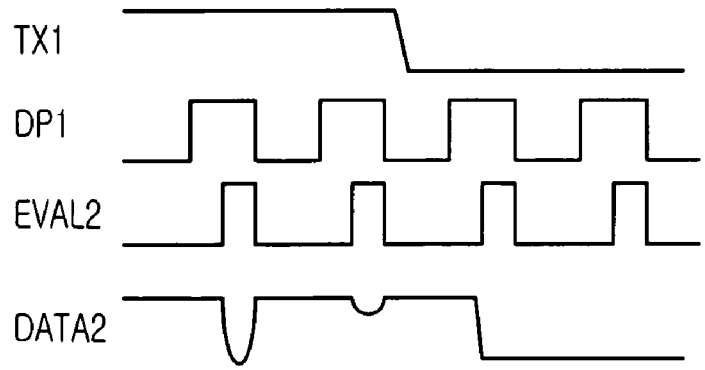
Figure 10:
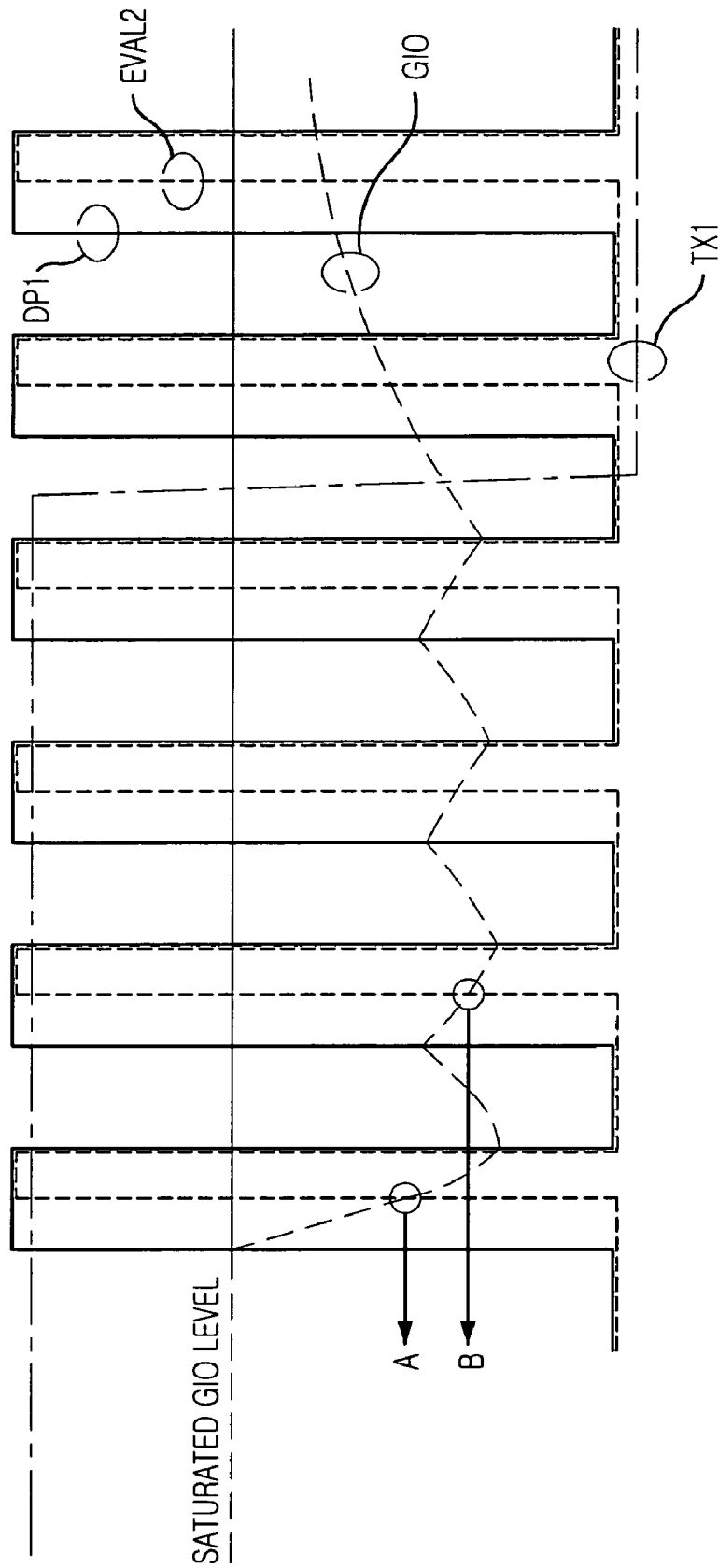
FIG. 10 is a waveform describing why a read failure of the first high data occurs.
Figure 11:
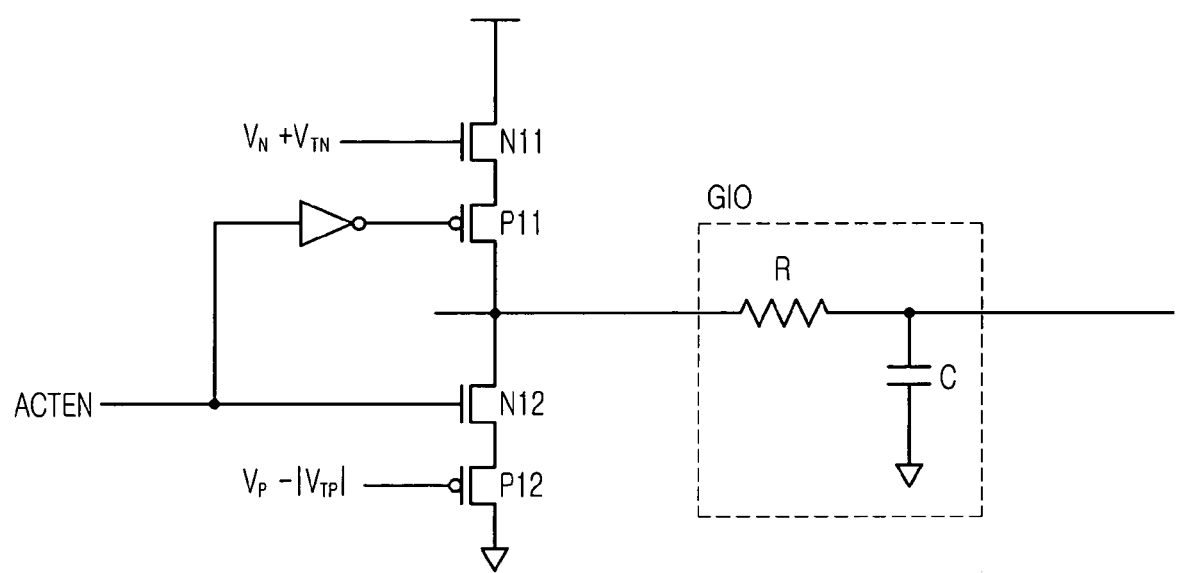
FIG. 11 is a schematic circuit diagram depicting a global data bus termination unit for use in the multi-port semiconductor memory device in accordance with a preferred embodiment of the present invention.

FIG. 11 is a schematic circuit diagram depicting a global data bus termination unit for use in the multi-port semiconductor memory device in accordance with a preferred embodiment of the present invention.

As shown, the global data bus termination unit includes a first NMOS transistor N11 whose first terminal connected to the power supply voltage VDD, a first PMOS transistor P11 connected between a second terminal of the first NMOS transistor N11 and the global data bus GIO, a second PMOS transistor P12 whose first terminal is connected to the ground voltage VSS, and a second NMOS transistor N12 connected between a second terminal of the second PMOS transistor P12 and the global data bus GIO.

The first NMOS transistor N11 receives a first voltage $(V_N+V_{TN})$ obtained by adding a threshold voltage $V_{TN}$ of the first NMOS transistor N11 to a minimum GIO voltage $V_N$. A level of the minimum GIO voltage $V_N$ is higher than the ground voltage VSS level. The first PMOS transistor P11 receives an inverted active mode signal ACTEN through a gate. The second NMOS transistor N12 receives an active mode signal ACTEN through a gate. Herein, the active mode signal ACTEN becomes logically high when the multi-port memory device operates in an active mode. The second PMOS transistor P12 receives a second voltage $(V_P-|V_{TP}|)$ obtained by subtracting an absolute value of a threshold voltage $V_{TP}$ of the second PMOS transistor P12 from a maximum GIO voltage $V_P$. A level of the maximum GIO voltage is lower than the power supply voltage VDD level and the saturated GIO level.

Figure 12:
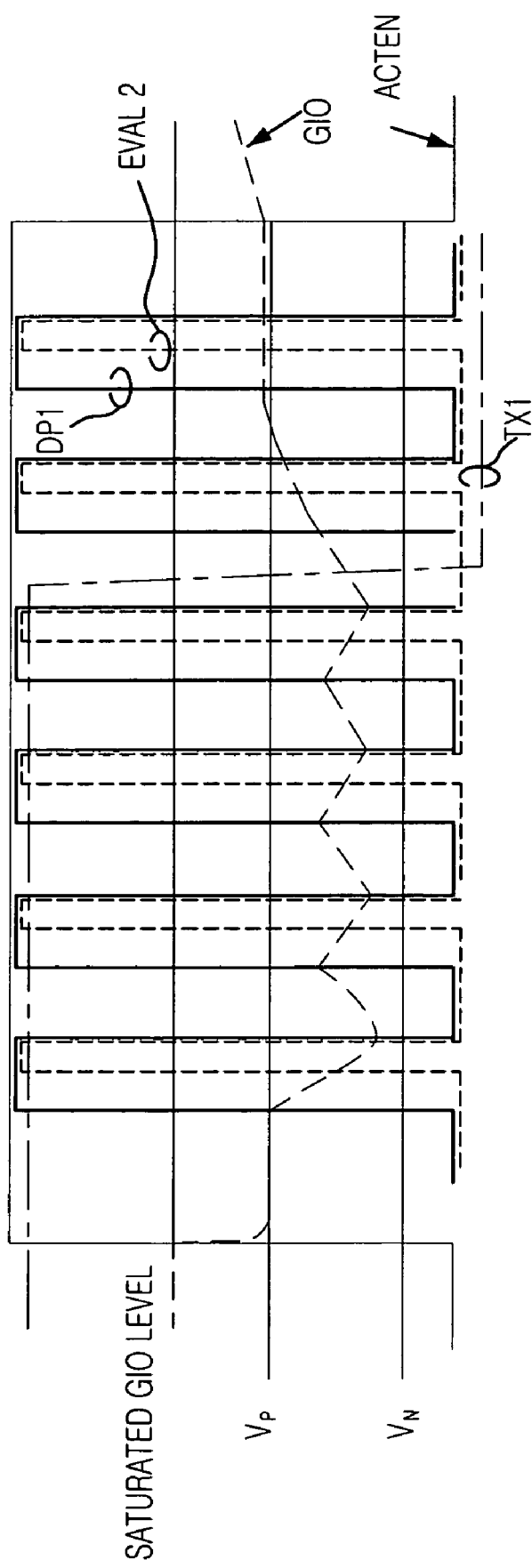
FIG. 12 is a waveform demonstrating an operation of the global data bus termination unit shown in FIG. 11 in case of the read operation.

FIG. 12 is a waveform demonstrating an operation of the global data bus termination unit shown in FIG. 11 in case of the read operation.

Initially, the level of the global data bus GIO has the saturated GIO level. After the active mode signal ACTEN is activated as a logic high level, the first PMOS transistor P11 and the second NMOS transistor N12 are turned on. Herein, the level of the global data bus GIO is the saturated GIO level which is higher than the maximum GIO voltage $V_P$. Therefore, the second PMOS transistor P12 receiving the second voltage $(V_P-|V_{TP}|)$ is turned on because a gate-source voltage of the second PMOS transistor P12 is higher than the absolute value of the threshold voltage $V_{TP}$ of the second PMOS transistor P12. AS a result, an electric charge of the global data bus GIO is discharged to the ground voltage via the second NMOS transistor N12 and the second PMOS transistor P12. Thereafter, when the level of the global data bus GIO reaches to the maximum GIO voltage $V_P$, the second PMOS transistor P12 is turned off and, thus, the global data bus GIO maintains the maximum GIO voltage $V_P$.

After the first drive pulse DP1 is activated as a logic high level in response to the read command while the first data TX1 is in a logic high level, the transmitter TX in the bus connector TL discharges the global data bus GIO. Then, when the level of the global data bus GIO becomes lower than the minimum GIO voltage $V_N$, the first NMOS transistor N11 is turned on because a gate-source voltage of the first NMOS transistor N11 is higher than the threshold voltage $V_{TN}$ of the first NMOS transistor N11. Therefore, the level of the global data bus GIO does not decrease below the minimum GIO voltage $V_N$ even though a pulse width of the first drive pulse DP1 is sufficiently wide.

Thereafter, when the first drive pulse DP1 is deactivated as a logic low level, the receiver QRX charges the global data bus GIO and, therefore, the level of the global data bus GIO is increased. In this case, the level of the global data bus GIO does not increase over the maximum GIO voltage $V_P$ because of the second PMOS transistor P12.

As previously described, the global data bus termination unit of the present invention controls the global data bus GIO to transmit the data of a logic high level in a range between the minimum GIO voltage $V_N$ and the maximum GIO voltage $V_P$ in response to the active mode signal ACTEN.

Meanwhile, in case that the first data TX1 is in a logic low level, the level of the global data bus GIO increases over the maximum GIO voltage $V_P$ because the transmitter TX does not discharge the global data bus GIO. Then, when the active mode signal ACTEN is deactivated as a logic low level, the first PMOS transistor P11 and the second NMOS transistor N12 are turned off. Therefore, the level of the global data bus GIO recovers the saturated GIO level if the pulse width of the first drive pulse DP1 is sufficiently given.

Herein, the present invention controls the global data bus GIO to transmit the data of a logic high level in a range between the minimum GIO voltage $V_N$ and the maximum GIO voltage $V_P$ by using the active mode signal ACTEN in order to reduce a current consumption.

Further, in another embodiment, the location of the first NMOS transistor N11 and the first PMOS transistor P11 and the location of the second NMOS transistor N12 and the second PMOS transistor P12 can be replaced by each other.

Figure 13:
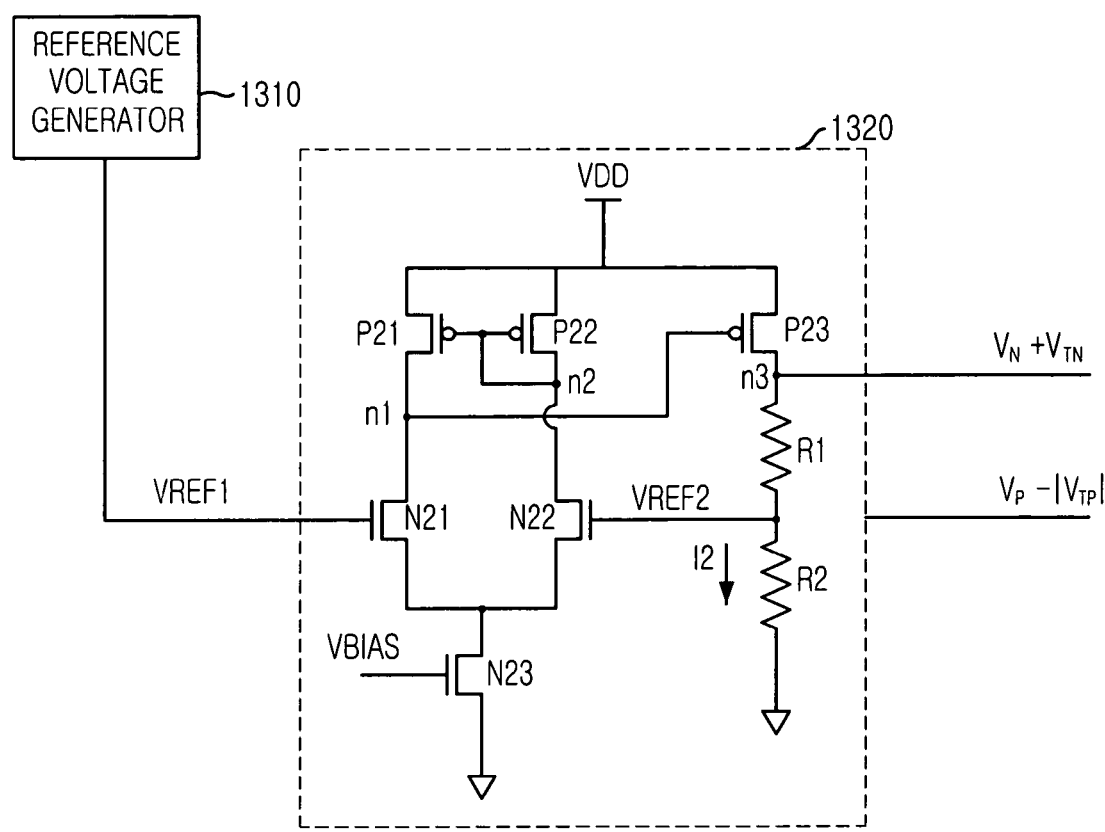
FIG. 13 is a block diagram showing a voltage generator for generating the first voltage ($V_N+V_{TN}$) and the second voltage ($V_P-|V_{TP}|$)

FIG. 13 is a block diagram showing a voltage generator for generating the first voltage $(V_N+V_{TN})$ and the second voltage $(V_P-|V_{TP}|)$.

As shown, the voltage generator includes a reference voltage generator 1310 for generating a constant reference voltage VREF1 and a level shifter 1320 for generating the first voltage $(V_N+V_{TN})$ and the second voltage $(V_P-|V_{TP}|)$. Herein, the reference voltage generator 1310 is implemented with a generator of a widlar type or a generator of a band-gap type.

Further, the level shifter 1320 includes three PMOS transistors P21 to P23, three NMOS transistors N21 to N23, and a voltage divider provided with two resistors R1 and R2.

The sink NMOS transistor N23 connected to the ground voltage VSS receives a bias voltage VBIAS through a gate. The first input NMOS transistor N21 connected between the sink NMOS transistor N 23 and a first node n1 receives the constant reference voltage VREF1 through a gate. The second input NMOS transistor N22 connected between the sink NMOS transistor N23 and a second node n2 receives a feedback reference voltage VREF2 through a gate. The first load PMOS transistor P21 connected between the first node n1 and the power supply voltage VDD receives a voltage loaded at the second node n2. The second load PMOS transistor P22 connected between the second node n2 and the power supply voltage VDD receives the voltage loaded at the second node n2. The drive PMOS transistor P23 connected between the power supply voltage VDD and a third node n3 receives a voltage loaded at the first node n1. The voltage divider connected between the third node n3 and the ground voltage VSS provides the feedback reference voltage VREF2 to the second input NMOS transistor N22.

Herein, the first and the second load PMOS transistors P21 and P22 form a current mirror. Further, the voltage divider can be implemented with a plurality of resistors in order to generate the second voltage ($V_P-|V_{TP}|$) of a desired level. Therefore, the level of the second voltage ($V_P-|V_{TP}|$) is not always same with that of the feedback reference voltage VREF2.

Meanwhile, the first voltage ($V_N+V_{TN}$) is outputted from the third node n3, and the second voltage ($V_P-|V_{TP}|$) is outputted from a node in the voltage divider. Therefore, the level of the first voltage ($V_N+V_{TN}$) is higher than the level of the second voltage ($V_P-V_{TP}|$).

Figure 14:
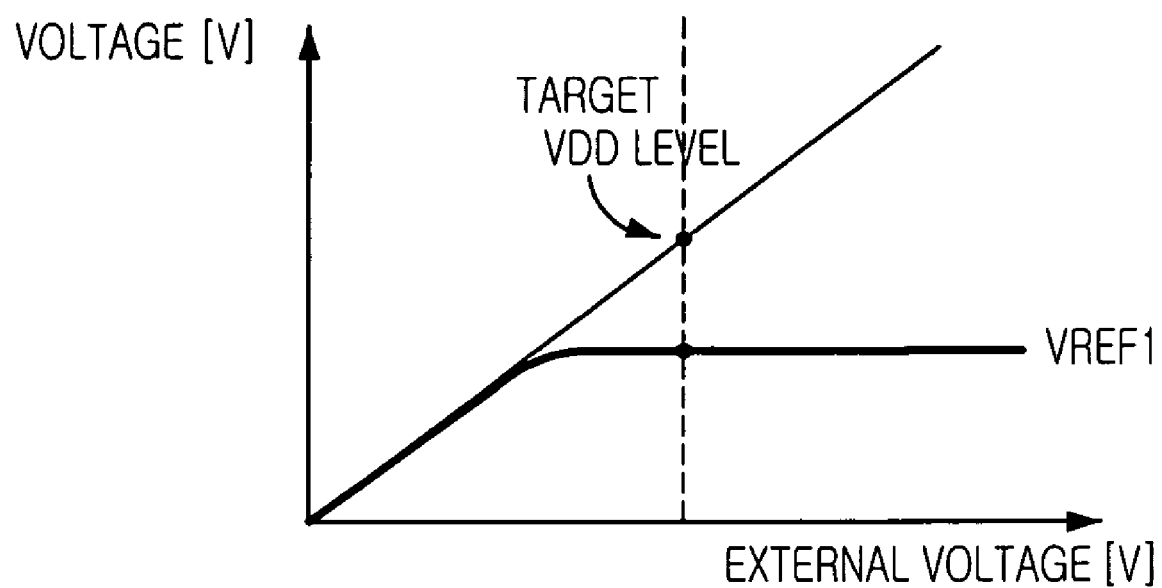
FIG. 14 is a graph describing a relationship between a power supply voltage and a constant reference voltage outputted from a reference voltage generator.

FIG. 14 is a graph describing a relationship between the power supply voltage VDD and the constant reference voltage VREF1 outputted from the reference voltage generator 1310.

As shown, the level of the constant reference voltage VREF1 is increased proportionally to the power supply voltage VDD at first. Then, after reaching to a predetermined level, the level of the constant reference voltage VREF1 holds the predetermined level even though the level of the power supply voltage VDD continuously increases.

Hereinafter, an operation of the level shifter shown in FIG. 13 in case that the bias voltage VBIAS is in a logic high level and a resistance ratio of the resistors R1 and R2 of the voltage divider is 1:1 is explained.

First, after the constant reference voltage VREF1 turns on the first input NMOS transistor N21, the voltage loaded at the first node is discharged through the sink NMOS transistor N23. Accordingly, the drive PMOS transistor P23 is turned on to transmit a current through the voltage divider. Therefore, the level of the feedback reference voltage VREF2 is increased.

When the level of the feedback reference voltage VREF2 is increased, a channel of the drive PMOS transistor P23 is reduced by the current mirror provided with the first and the second input PMOS transistors P21 and P22. Thereafter, after reaching to the level of the constant reference voltage VREF1, the level of the feedback reference voltage VREF2 does not increase any more. As a result, the level of the feedback reference voltage VREF2 is the same with that of the constant reference voltage VREF1.

Herein, because the resistance ratio of the resistors R1 and R2 in the voltage divider is 1:1, the current I2 flowing through the second resistor R2 is defined as VREF2/R2. Further, the current I2 also flows through the first resistor R1.

Generally, the first voltage ($V_N+V_{TN}$) is defined as follows.

$$V_N+V_{TN}=(VREF2/R2)\leftarrow(R1+R2)=VREF2\leftarrow(1+(R1/R2))=VREF1\leftarrow(R1/R2)) \quad \text{(Eq. 1)}$$

That is, the first voltage ($V_N+V_{TN}$) is determined by the resistance ratio of the resistors R1 and R2 in the voltage divider and the level of the constant reference voltage VREF1.

Further, the second voltage ($V_P-|V_{TP}|$) does not have a direct relationship with the feedback reference voltage VREF2. The second voltage ($V_P-|V_{TP}|$) is generated by dividing the level of the first voltage ($V_N+V_{TN}$). Therefore, the level of the second voltage ($V_P-|V_{TP}|$) is lower than that of the first voltage ($V_N+V_{TN}$).

The present invention pulls down the level of the global data bus GIO to the level of the maximum GIO voltage $V_P$ before transmitting the data in order to prevent a data failure of the first high data.

Moreover, the present invention controls the global data bus GIO to transmit the data in a range between the minimum GIO voltage $V_N$ and the maximum GIO voltage $V_P$ by using the active mode signal ACTEN in order to reduce current consumption. Therefore, a size of the transistors in the transmitters TX and QTX for discharging the global data bus GIO can be reduced and a data transmission speed increases.

Figure 15:
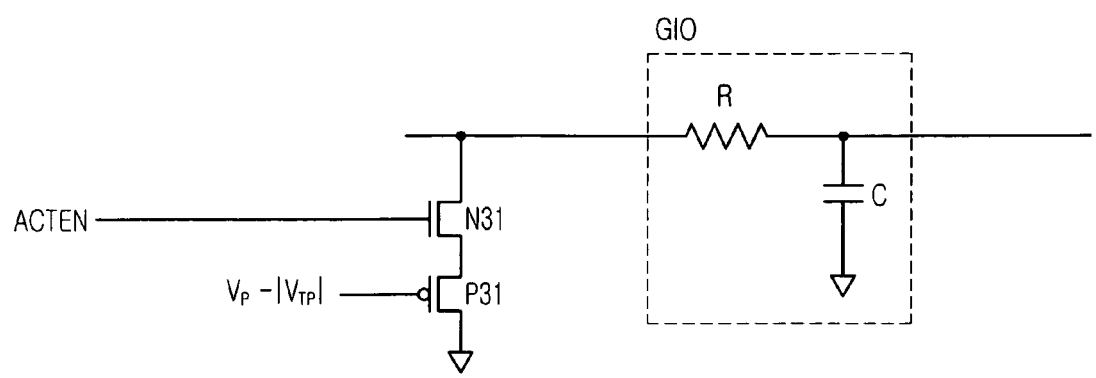
FIG. 15 is a schematic circuit diagram depicting a global data bus termination unit in accordance with another preferred embodiment of the present invention.

FIG. 15 is a schematic circuit diagram depicting a global data bus termination unit in accordance with another preferred embodiment of the present invention.

As shown, the global data termination unit includes a PMOS transistor P31 connected to the ground voltage VSS for receiving the second voltage ($V_P-|V_{TP}|$) through a gate and a NMOS transistor N31 connected between the PMOS transistor P31 and the global data bus GIO for receiving the active mode signal ACTEN through a gate.

That is, the global data bus termination unit shown in FIG. 15 controls the global data bus GIO to transmit the data in a range between the maximum GIO voltage $V_P$ and the ground voltage VSS.

Further, in another embodiment, the location of the NMOS transistor N31 and the PMOS transistor P31 can be replaced each other.

Figure 16:
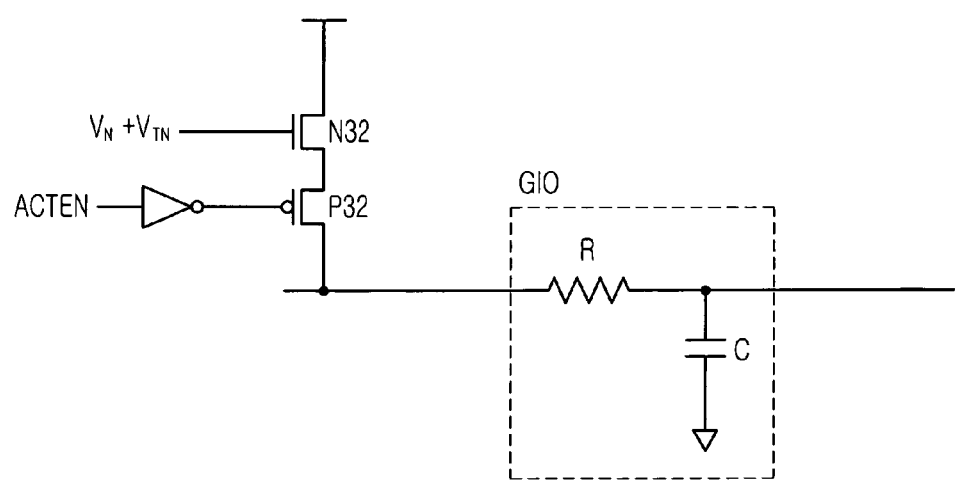
FIG. 16 is a schematic circuit diagram showing a global data bus termination unit in accordance with still another preferred embodiment of the present invention.

FIG. 16 is a schematic circuit diagram showing a global data bus termination unit in accordance with still another preferred embodiment of the present invention.

As shown, the global data termination unit includes a NMOS transistor N32 connected to the power supply voltage VDD for receiving the first voltage ($V_N+V_{TN}$) through a gate and a PMOS transistor P32 connected between the NMOS transistor N32 and the global data bus GIO for receiving the inverted active mode signal ACTEN through a gate.

The global data bus termination unit shown in FIG. 16 controls the global data bus GIO to transmit the data in a range between the minimum GIO voltage $V_N$ and the power supply voltage VDD. In this case, the data failure of the first high data is hard to improve. However, the data transmission speed is improved compared with the conventional art.

Also, in another embodiment, the location of the NMOS transistor N32 and the PMOS transistor P32 can replace each other.

The global data bus termination units shown in FIGS. 15 and 16 can use the voltage generator shown in FIG. 13 in order to generate the first voltage ($V_N+V_{TN}$) and the second voltage ($V_P-|V_{TP}|$).

In another embodiment, the present invention also can be applied to other multi-port memory devices having a RAM cell such as a static random access memory (SRAM). Further, the number of the multi-port memory device and the banks can be varied according to a capacity of the memory device and a chip size. Still further, transistors and logic gates used in the above-mentioned embodiment can be changed according to a polarity of signals.

In above-mentioned embodiments, the active mode signal ACTEN is activated as a logic high level, however, in another embodiment, the active mode signal ACTEN can be activated as a logic low level.

The present invention provides a multi-port memory device for preventing a data failure of the first high data to improve an operation speed.

The present application contains subject matter related to Korean patent application No. 2005-29431, filed in the Korean Patent Office on Apr. 08, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A multi-port memory device, comprising:
   a global data bus;
   a plurality of transmitters and receivers;
   a termination means for controlling the global data bus to transmit the data in a range of a first voltage to a second voltage in response to an active mode signal; and
   a voltage generator for generating the first and the second voltages,
   wherein the first voltage is higher than a ground voltage and the second voltage is lower than a power supply voltage.

2. The multi-port memory device as recited in claim 1, wherein the termination means includes:
   a first NMOS transistor having a gate and a first terminal, the first terminal is connected to a power supply voltage terminal for receiving a third voltage through its gate, the third voltage obtained by adding a threshold voltage of the first NMOS transistor to the first voltage;
   a first PMOS transistor having a gate, connected between a second terminal of the first NMOS transistor and the global data bus, for receiving an inverted active mode signal through its gate;
   a second PMOS transistor having a gate and a first terminal, the second PMOS transistor's first terminal is connected to a ground voltage terminal for receiving a fourth voltage through its gate, the fourth voltage obtained by subtracting an absolute value of a threshold voltage of the second PMOS transistor from the second voltage; and
   a second NMOS transistor having a gate, connected between a second terminal of the second PMOS transistor and the global data bus, for receiving the active mode signal through its gate.

3. The multi-port memory device as recited in claim 2, wherein the voltage generator includes:
   a reference voltage generator for generating a constant reference voltage based on the power supply voltage; and
   a level shifter for receiving the constant reference voltage to generate the first and the second voltages.

4. The multi-port memory device as recited in claim 3, wherein the level shifter includes:
   a sink NMOS transistor having a gate, connected to the ground voltage terminal, for receiving a bias voltage through its gate;
   a first input NMOS transistor having a gate, connected between the sink NMOS transistor and a first node, for receiving the constant reference voltage through its gate;
   a second input NMOS transistor having a gate, connected between the sink NMOS transistor and a second node, for receiving a feedback reference voltage through its gate;
   a first load PMOS transistor, connected between the first node and the power supply voltage terminal, for receiving a voltage loaded at the second node;
   a second load PMOS transistor, connected between the second node and the power supply voltage terminal, for receiving the voltage loaded at the second node;
   a drive PMOS transistor, connected between the power supply voltage terminal and a third node, for receiving a voltage loaded at the first node; and
   a voltage divider, connected between the third node and the ground voltage terminal, for providing the feedback reference voltage,
   wherein the first and the second load PMOS transistors form a current mirror and the third and the fourth voltages are outputted through the third node and an output terminal of the voltage divider, respectively.

5. The multi-port memory device as recited in claim 3, wherein the reference voltage generator is one of a widlar generator and a band-gap generator.

6. The multi-port memory device as recited in claim 2, wherein each of the transmitters includes a third and a fourth NMOS transistors serially connected to each other between the global data bus and the ground voltage terminal, the third and the fourth NMOS transistors respectively receiving a drive pulse and the data through their gates.

7. The multi-port memory device as recited in claim 6, wherein each of the receivers is a current sensing receiver and includes:
   a third PMOS transistor whose first terminal is connected to the power supply voltage terminal and second terminal and gate are diode-connected to each other;
   a fourth PMOS transistor whose first terminal is connected to the power supply voltage terminal and second terminal is connected to an output terminal;
   a fifth NMOS transistor having a first terminal connected to the second terminal of the third PMOS transistor, a second terminal connected to the global data bus, and a gate receiving a reference voltage;
   a sixth NMOS transistor having a gate and a first terminal, the first terminal is connected to the output terminal and its gate receives the reference voltage; and
   a seventh NMOS transistor having a first terminal connected to a second terminal of the sixth NMOS transistor, a second terminal connected to the ground voltage terminal, and a gate receiving an evaluation signal.

8. The multi-port memory device as recited in claim 1, wherein the termination means includes:
   a first PMOS transistor whose first terminal is connected to a power supply voltage terminal for receiving an inverted active mode signal;
   a first NMOS transistor having a gate, connected between a second terminal of the first PMOS transistor and the global data bus, for receiving a third voltage through its gate, the third voltage obtained by adding a threshold voltage of the first NMOS transistor to the first voltage;
   a second NMOS transistor having a gate and a first terminal, the first terminal is connected to a ground voltage terminal for receiving the active mode signal through its gate; and
   a second PMOS transistor having a gate, connected between a second terminal of the second NMOS transistor and the global data bus, for receiving a fourth voltage through its gate, the fourth voltage obtained by subtracting an absolute value of a threshold voltage of the second PMOS transistor from the second voltage.

9. The multi-port memory device recited in claim 1, wherein the transmitters and receivers each operate to exchange data with the global data bus.

10. A multi-port memory device, comprising:
    a global data bus;
    a plurality of transmitters and receivers;

a termination means for controlling the global data bus to transmit data in a range of a ground voltage to a first voltage, which is lower than a power supply voltage, in response to an active mode signal; and a voltage generator for generating the first voltage.

11. The multi-port memory device as recited in claim 10, wherein the termination means includes:

a first PMOS transistor having a gate and a first terminal, the first terminal is connected to a ground voltage terminal for receiving a second voltage through its gate; and a first NMOS transistor having a gate, connected between a second terminal of the first PMOS transistor and the global data bus, for receiving the active mode signal through its gate, wherein the second voltage is obtained by subtracting an absolute value of a threshold voltage of the first PMOS transistor from the first voltage.

12. The multi-port memory device as recited in claim 11, wherein the voltage generator includes:

a reference voltage generator for generating a constant reference voltage based on the power supply voltage; and a level shifter for generating the first voltage based on the constant reference voltage.

13. The multi-port memory device as recited in claim 12, wherein the level shifter includes:

a sink NMOS transistor having a gate, connected to the ground voltage terminal, for receiving a bias voltage through its gate;

a first input NMOS transistor having a gate, connected between the sink NMOS transistor and a first node, for receiving the constant reference voltage through its gate;

a second input NMOS transistor having a gate, connected between the sink NMOS transistor and a second node, for receiving a feedback reference voltage through its gate;

a first load PMOS transistor, connected between the first node and a power supply voltage terminal, for receiving a voltage loaded at the second node;

a second load PMOS transistor, connected between the second node and the power supply voltage terminal, for receiving the voltage loaded at the second node;

a drive PMOS transistor, connected between the power supply voltage terminal and a third node, for receiving a voltage loaded at the first node; and a voltage divider, connected between the third node and the ground voltage terminal, for providing the feedback reference voltage, wherein the first and the second load PMOS transistors form a current mirror and the first voltage is outputted through an output terminal of the voltage divider.

14. The multi-port memory device as recited in claim 12, wherein the reference voltage generator is provided with one of a widlar generator and a band-gap generator.

15. The multi-port memory device as recited in claim 11, wherein each of the transmitters includes a second and a third NMOS transistor serially connected to each other between the global data bus and the ground voltage terminal, the second and the third NMOS transistors respectively receiving a drive pulse and data through their gates.

16. The multi-port memory device as recited in claim 15, wherein each of the receivers includes:

a second PMOS transistor whose first terminal is connected to a power supply voltage terminal and second terminal and gate are diode-connected to each other;

a third PMOS transistor whose first terminal is connected to the power supply voltage terminal and second terminal is connected to an output terminal;

a fourth NMOS transistor having a first terminal connected to the second terminal of the second PMOS transistor, a second terminal connected to the global data bus, and a gate receiving a reference voltage;

a fifth NMOS transistor whose first terminal is connected to the output terminal and gate receives the reference voltage; and a sixth NMOS transistor having a first terminal connected to a second terminal of the fifth NMOS transistor, a second terminal connected to the ground voltage terminal, and a gate receiving an evaluation signal.

17. The multi-port memory device as recited in claim 10, wherein the termination means includes:

a first NMOS transistor having a gate and a first terminal, the first terminal is connected to the ground voltage terminal for receiving the active mode signal through its gate; and a first PMOS transistor having a gate, connected between a second terminal of the first NMOS transistor and the global data bus, for receiving a second voltage through its gate, wherein the second voltage is obtained by subtracting an absolute value of a threshold voltage of the first PMOS transistor from the first voltage.

18. The multi-port memory device as recited in claim 10, wherein the plurality of transmitters are each current sensing transmitters and the plurality of receivers are each current sensing receivers, and the plurality of transmitters and the plurality of receivers each operate to exchange data with the global data bus.

19. A multi-port memory device, comprising:

a global data bus;

a plurality of transmitters and receivers;

a termination means for controlling the global data bus to transmit the data in a range of a power supply voltage to a first voltage, which is higher than a ground voltage, in response to an active mode signal; and a voltage generator for generating the first voltage.

20. The multi-port memory device as recited in claim 19, wherein the termination means includes:

a first NMOS transistor having a gate and a first terminal, the first terminal is connected to a power supply voltage terminal for receiving a second voltage through its gate; and a first PMOS transistor having a gate, connected between a second terminal of the first NMOS transistor and the global data bus, for receiving an inverted active mode signal through its gate, wherein the second voltage is obtained by adding a threshold voltage of the first NMOS transistor to the first voltage.

21. The multi-port memory device as recited in claim 19, wherein the termination means includes:

a first PMOS transistor having a gate and a first terminal, the first terminal is connected to a power supply voltage terminal for receiving an inverted active mode signal through its gate; and a first NMOS transistor having a gate, connected between a second terminal of the first PMOS transistor and the global data bus, for receiving a second voltage through its gate, wherein the second voltage is obtained by adding a threshold voltage of the first NMOS transistor to the first voltage.

22. The multi-port memory device as recited in claim 20, wherein the voltage generator includes:
- a reference voltage generator for generating a constant reference voltage based on the power supply voltage; and
- a level shifter for generating the first voltage based on the constant reference voltage.

23. The multi-port memory device as recited in claim 19, wherein the plurality of transmitters are each current sensing transmitters and the plurality of receivers are each current sensing receivers, and the plurality of transmitters and the plurality of receivers each operate to exchange data with the global data bus.

* * * * *